US007846649B2

(12) United States Patent
Tirosh et al.

(10) Patent No.: US 7,846,649 B2
(45) Date of Patent: Dec. 7, 2010

(54) HIGH RESOLUTION PRINTER AND A METHOD FOR HIGH RESOLUTION PRINTING

(75) Inventors: Ehud Tirosh, Mevaseret Zion (IL); Gilad Almogy, Kiriat Ono (IL); Meir Aloni, Hertzlia (IL); Doron Meshulach, Ramat Gan (IL)

(73) Assignee: Applied Materials Israel, Ltd., Rehovot (IL)

( * ) Notice: Subject to any disclaimer, the term of this patent is extended or adjusted under 35 U.S.C. 154(b) by 1301 days.

(21) Appl. No.: 10/940,347

(22) Filed: Sep. 13, 2004

(65) Prior Publication Data

US 2006/0055911 A1 Mar. 16, 2006

(51) Int. Cl.
*G03C 5/04* (2006.01)
(52) U.S. Cl. .................. 430/396; 430/394; 355/77; 355/53
(58) Field of Classification Search ........................ None
See application file for complete search history.

(56) References Cited

U.S. PATENT DOCUMENTS

| 6,133,986 | A | 10/2000 | Johnson | |
|---|---|---|---|---|
| 6,424,404 | B1 | 7/2002 | Johnson | |
| 6,498,685 | B1 * | 12/2002 | Johnson | 359/626 |
| 2003/0122091 | A1 * | 7/2003 | Almogy | 250/492.24 |
| 2003/0123040 | A1 | 7/2003 | Almogy | |

OTHER PUBLICATIONS

Tor Sandstrom and Niklas Eriksson, "Resolution Extensions in Sigma 7000 Imaging Pattern Generator" Proc. SPIE col. 4889, pp. 157-167 (2002).

* cited by examiner

*Primary Examiner*—Daborah Chacko Davis
(74) *Attorney, Agent, or Firm*—SNR Denton US LLP

(57) ABSTRACT

The invention provides a method and printer for printing an image that comprises at least one group of highly dense shapes, the method including: (i) determining multiple intermediate schemes such as to allow printing corresponding intermediate images on an object; wherein at least one intermediate scheme comprises directing at least one interference pattern toward at least one location corresponding to at least one group of highly dense shapes; (ii) generating an array of light entities in response to an intermediate scheme; (iii) directing the array of light entities towards the object to form the intermediate image; and (iv) moving the object relative to the light entities while repeating the steps of generating and directing to expose the object with the image.

The invention provides a system that includes: (i) means for determining multiple intermediate schemes such as to allow printing corresponding intermediate images on an object; wherein at least one intermediate scheme comprises directing at least one interference pattern towards at least one location corresponding to at least one group of highly dense shapes; (ii) a programmable optical radiation source for generating an array of light entities in response to an intermediate scheme; (iii) optics for directing the array of light entities towards the object to form the intermediate image; and (iv) a translator for moving the object relative to the light entities while repeating the steps of generating and directing to expose the object with the image.

13 Claims, 7 Drawing Sheets determining multiple intermediate schemes such as to allow printing corresponding intermediate images on a object; whereas at least one intermediate scheme comprises directing at least one interference pattern toward at least one location corresponding to the least one group of highly dense shapes
202 generating an array of light entities in response to an intermediate scheme
204 directing the array of light entities towards the object to form the intermediate image
206 introducing a relative translation between the object and the array of light entities
208

HIGH RESOLUTION PRINTER AND A METHOD FOR HIGH RESOLUTION PRINTING

FIELD OF THE INVENTION

The present invention relates to a high-resolution printer and method for high resolution printing of an image and especially for a high-resolution high-throughput maskless lithography printer and method.

BACKGROUND

Photolithography is a technique for producing images on semiconductor devices. Typically, an image formed on a mask or "reticle" is transferred to a semiconductor object, or wafer, where it exposes a resist layer placed on the object. It is desired to pattern smaller and smaller features on semiconductor objects, which requires the use of shorter and shorter wavelengths of the light that is used to image the patterns. The minimal printable feature size, referred to "Critical Dimension" is proportional to the wavelength of the radiation used by the printer and to a coefficient $k_1$, and inversely proportional to the Numerical Aperture (NA) of the optics printer. Typical printing schemes provide $k_1$ values of about 0.5-0.6.

Under these assumptions, decrease in wavelength to 193 nm or 157 nm enables imaging of patterns with resolutions of 110 nm and 90 nm, respectively. For further improvements in resolution, even shorter wavelengths are necessary.

Attempts to further decrease the optical wavelength to either Extreme UV (EUV or soft X-ray at wavelengths shorter than 20 nm) or to X-ray, as well as to use other sources such as electron beams, have so far been proven to be complex and expensive. It is, therefore, desirable to develop optical techniques capable of decreasing $k_1$ values achieved in optical lithography. Such techniques are referred to as Resolution Enhancement Techniques or RET. The most commonly used RET methods consist of the use of Phase Shift Masks (PSM), use of Optical Proximity Correction (OPC), and use of oblique illumination. These techniques can provide for a minimum theoretical $k_1$ value of 0.25 for a dense pattern. $k_1$ values as small as 0.30 have been demonstrated.

Due to decreasing design rules and the wide use of RET the masks used in image-projection systems have become increasingly difficult and expensive to make. Since many masks are needed to form the multiple patterns required to manufacture an integrated circuit, the time delay in making the masks and the cost of the masks themselves is a significant cost in the manufacture of semiconductor devices. This is especially so in the case of smaller volume devices, where the cost of the masks cannot be amortized over a large number of devices. Thus, it is desirable to provide a high-throughput apparatus for making semiconductor chips while eliminating the need for expensive masks. It is also desirable to improve the obtainable resolution of optical lithography. Further, such a device may be useful for directly patterning a small number of objects, such as runs of prototype devices, and for making masks.

Various maskless lithography methods are known in the art. A first method is a stepper-like lithography method in which an entire continuous area of an image is printed simultaneously. Such a method is described by Tod Sandstrom and Niklas Eriksson in "Resolution Extensions in sigma 7000 imaging pattern generator" Proc. SPIE Vol. 4889, pp. 157-167 (2002). This method consists of a Spatial Light Modulator (SLM), which operates as a reflective, 2D programmable mask, and a DUV pulsed-laser source. The pattern is formed by stitching together from multiple SLM images where each sub-image is created with a single flash, while the stage carrying the wafer is moving continuously.

The SLM used in this architecture has continuous pixels (i.e. there is no substantial physical gap between adjacent pixels). Analog modulation, which is capable of creating gray-level modulation with negative amplitude (refers to as "Blacker than black"), is used. As a result, this technique allows for some RET techniques, such as Attenuated Phase Shift Mask. Nevertheless, the main drawback of this technique is that since it uses very small instantaneous field of views, high speed printing requires high speed of the stage. This limits the printing speed due to stage inaccuracies, and may also limit its possible use in conjunction with, immersion lithography. Also, since pulsed laser illumination is used in order to "freeze" the instantaneous Field of View location, multiple laser pulses cannot be used for noise reduction by averaging.

The second method includes imaging multiple spots that are distant from each other. Such a method is described at U.S. Pat. No. 6,133,986 of Johnson and U.S patent applications 20030123040 and 20030122091 of Almogy that are incorporated herein by reference. In this method adjacent spots are printed at different times. As a result, exposure signals are added incoherently, regardless of the phase and illumination method used to create a single spot. Since the use of RET requires spatial coherence, the latter method is not suitable for RET, and therefore has limited resolution.

Accordingly, it is desirable to develop an efficient high-resolution printer and high resolution method for printing patterns.

SUMMARY OF THE INVENTION

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

The invention provides a method and printer for printing an image that comprises at least one group of highly dense shapes, the method including: (i) determining multiple intermediate schemes such as to allow printing corresponding intermediate images on an object; wherein at least one intermediate scheme comprises directing at least one interference pattern toward at least one location corresponding to at least one group of highly dense shapes; (ii) generating an array of light entities in response to an intermediate scheme; (iii) directing the array of light entities towards the object to form the intermediate image; and (iv) moving the object relative to the light entities while repeating the steps of generating and directing to expose the object with the image.

The invention provide a system that includes: (i) means for determining multiple intermediate schemes such as to allow printing corresponding intermediate images on a object; wherein at least one intermediate scheme comprises directing at least one interference pattern toward at least one location corresponding to at least one group of highly dense shapes; (ii) a programmable optical radiation source for generating an array of light entities in response to an intermediate scheme; (iii) optics for directing the array of light entities towards the object to form the intermediate image; and (iv) a translator for moving the object relative to the light entities while repeating the steps of generating and directing to expose the object with the image.

BRIEF DESCRIPTION OF THE DRAWINGS

Reference is made to the attached drawings, wherein elements having the same reference numeral designations represent like elements throughout, and wherein:

FIG. 5 is a flow chart of method 200 for printing an image that includes at least one group of highly dense shapes in accordance with an embodiment of the invention.

DESCRIPTION OF THE INVENTION

According to various embodiments of the invention the printer is capable of printing an image that includes at least one group of highly dense shapes, the printer includes (i) means for determining multiple intermediate schemes such as to allow printing corresponding intermediate images on an object; wherein at least one intermediate scheme comprises directing at least one interference pattern towards at least one location corresponding to at least one group of highly dense shapes; (ii) a programmable optical radiation source for generating an array of light entities in response to an intermediate scheme; (iii) optics for directing the array of light entities towards the object to form the intermediate image; and (iv) a translator for moving the object relative to the light entities while repeating the steps of generating and directing to expose the object with the image.

High resolution printing of highly dense patterns can be achieved by using, instead of a light beam, interference patterns that include multiple dense interference fringes. Multiple fringes can be positioned within an area that corresponds to a cross section of a single beam.

Figure 1:
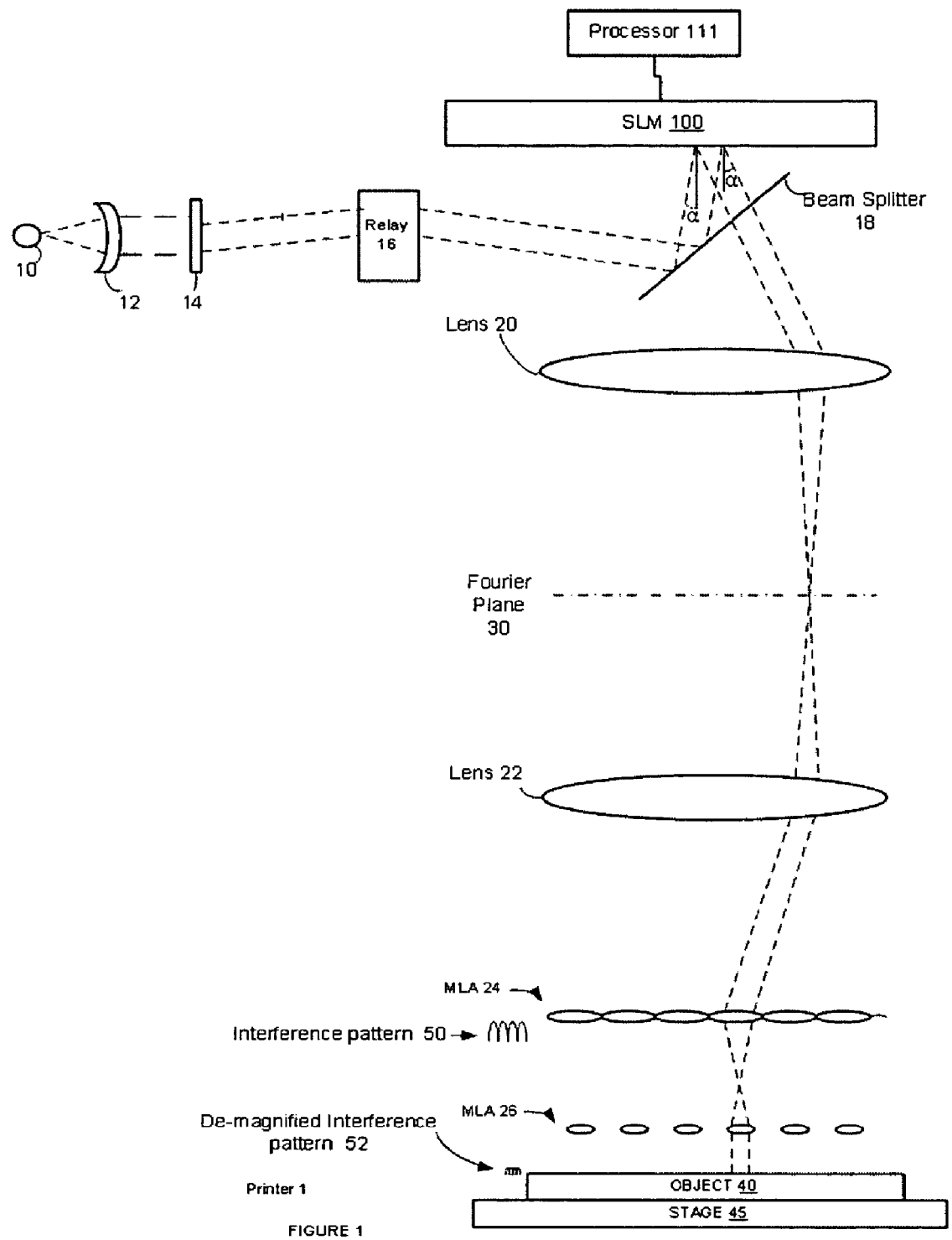
FIG. 1 illustrates a portion of a printer as well as a single light beam out of a pair of light beams that are directed towards a modulation area of a spatial light modulator, in accordance with an embodiment of the invention.

FIG. 1 illustrates a portion of printer 1, as well as a single light beam out of a pair of light beams that are directed towards a modulation area of a spatial light modulator. The two beams are modulated to provide an interference pattern that is relayed, de-magnified and directed towards an object. The printer is able to generate and direct multiple light entities towards the object substantially simultaneously. The spatial light modulator includes multiple modulation areas, each for modulating light to provide a single light entity.

The printer is capable of printing shapes at a first resolution and a group of highly dense shapes at a higher resolution. The first resolution is usually determined by the wavelength of the light as well as the optical characteristics of the printer. These characteristics may include numerical aperture or various lenses such as lens 22, the de-magnification micro-lenses array 24 and 26 and the diffraction of light passing through the printer.

Typically, printing at the first resolution is achieved by directing multiple light beams towards the spatial light modulator and reflecting only a portion of said beams, in response to an intermediate image to be printed on the object. This type of illumination may resemble the spot grid array of Johnson and of Almogy.

According to various aspects of the invention a processor is capable of receiving an image to be printed and determining if the image includes one or more groups of highly dense shapes, such as but not limited to an array of parallel lines. The one or more groups are printed by imaging interference patterns towards the location of the one or more group. As each interference pattern is relatively small, a group can be printed by multiple exposures of the interference patterns.

According to an embodiment of the invention the printer may print, during a first printing iteration, shapes at a first resolution, and then print, during a second iteration, shapes at a fine resolution by directing interference patterns that have a period that is smaller than the resolution of the printer, towards the object.

According to another embodiment of the invention the printer may include a first pass for directing interference patterns towards locations associated with the one or more highly dense group of objects and a second pass for directing light beams towards other locations. Each pass may include a programmable light source and optics, but the light to both paths may be provided by a single light source.

A programmable optical radiation source may include, for example, light source 10, optical components 12, 14 and 16, beam splitter 18 and a programmable SLM 100. Programmable SLMs are known in the art and can include an array of micro-mirrors, such as those included within the DMD Model available from Texas Instruments of Dallas, Tex.

Element 14 may split a light beam to into two or more light beams that are oriented with respect to an optical axis that is perpendicular to element 14. This function is preferably achieved by the use of an exchangeable holographic grating, which splits the laser beam into multiple oblique beams, where the selection of a specific grating is determined by the required incidence direction, and its orientation.

The optics may include various relaying and magnifying optics such as objective lenses 20 and 22, as well as micro-lenses arrays (MLAs) 24 and 26.

The translator may include a stage 45 and mechanical compensation means. The stage 45 supports the object 40 and can move it along at least one axis.

Referring to FIG. 1, a light source 10 directs multiple beams of light towards optical components 12 and 14. For simplicity of explanation a single light beam is illustrated. This light beam is collimated by optical component 12 and then is split into two light beams that are oriented towards each other. The pair of light beams is relayed by relay 16 and beam splitter 18 onto a modulation area of spatial light modulator 100. FIG. 1 illustrates a single light beam that illuminates the modulation area at an angle of $\alpha$ relative to an optical axis that is perpendicular to the SLM 100. The second beam of light out of said pair illuminates the modulation area at an angle ($-\alpha$) relative to the optical axis. The angle $\alpha$ and its orientation is determined according to the shape, density and orientation of the pattern.

Figure 2:
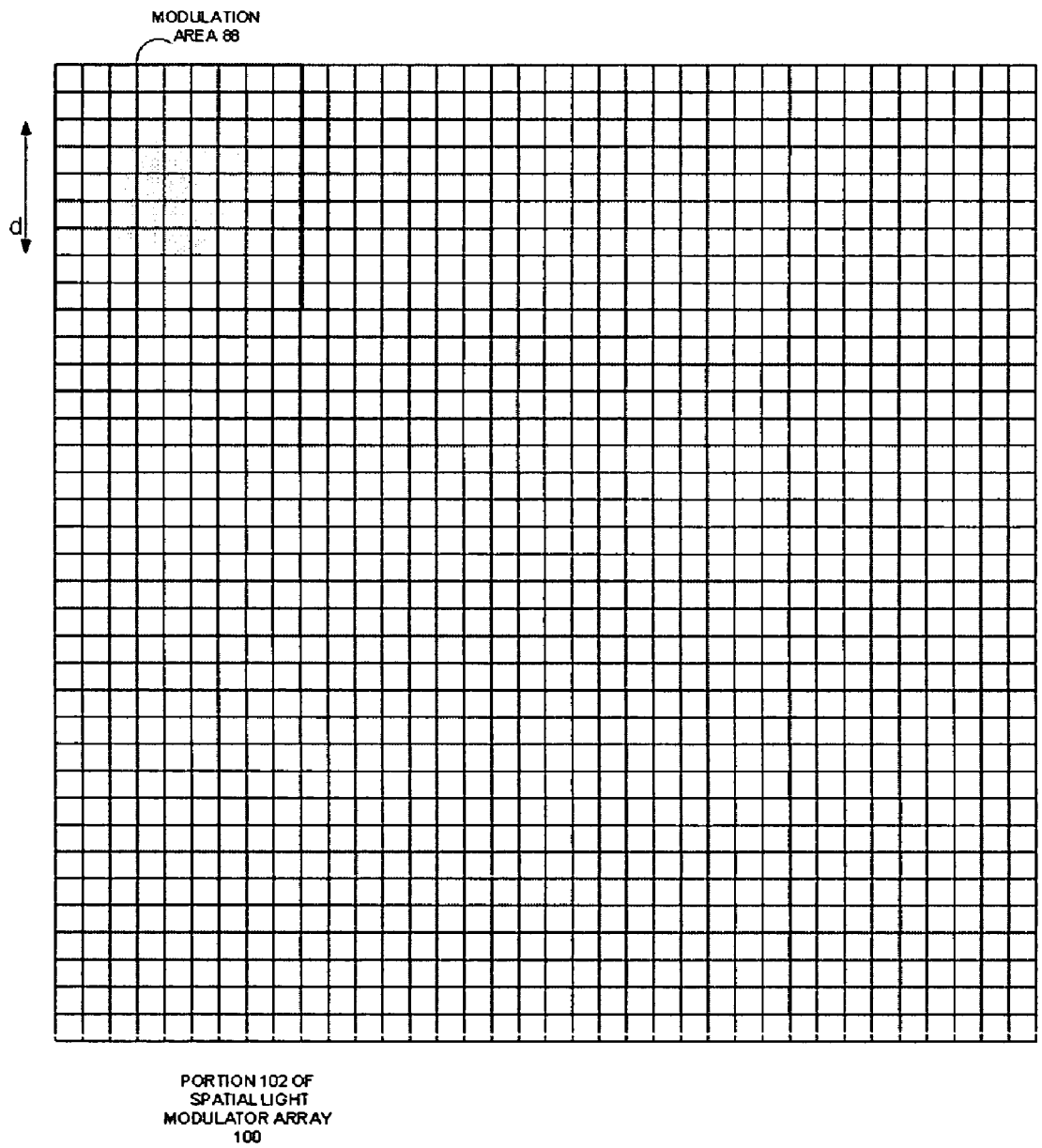
FIG. 2 illustrates a portion 102 of a programmable spatial light modulator, in accordance with an embodiment of the invention.

In order to generate an interference pattern such as pattern 50, the modulation area is configured such that some modulation elements are turned on while some are turned off. FIG. 2 also shows a cross section of an exemplary modulation area in which an array of five by five modulation elements are turned "on". As further illustrated in FIG. 2, each modulation area is two-dimensional and the modulation elements that are turned on form a two dimensional array, and the number of elements which are turned "on" determines the dimension d of a modulation area. As explained above, a typical number of modulation elements (referred to as "pixels") in a modulation area in this embodiment is 9×9, but other numbers of pixels are also possible. It's important to note that this scheme is not limited to turning "ON" N×N pixels: selection of arbitrary shapes within the 9×9 modulation area is possible.

The density of the interference fringes is responsive to the angle of incidence (a) of the two beams. Element 14 can be also utilized for determining an orientation of the interference patterns and for generating other interference patterns such as sharp edges and spots.

It is noted that when the printer operates at a first resolution, a single pixel in each modulating element may be used to reflect a light beam, as explained below. The modulation areas are well separated from one-another to prevent cross-talk or interference between the beams.

The mentioned above illumination and modulation creates two SINC patterns in Fourier plane 30 positioned at a focal point of lenses 20 and 22. In mathematical terms, the light entity that is formed at an intermediate image plane can be described by the following equation: $I(x,y) = \{\cos(2\pi \cdot \eta \cdot NA \cdot x/\lambda) \cdot \text{rect}(x/d) \cdot \text{rect}(y/d) \otimes [2J_1(q)/q]\}^2$, whereas $q = 2\pi \cdot NA/\lambda$; $\eta$ equals $\sin(\alpha)/NA$, whereas NA is the Numerical Aperture, and $J_1$ is the Bessel function of the first kind order one at said intermediate image plane, $\otimes$ represents a convolution operation and the value of function rect $(s) = 1$ if $-\frac{1}{2} < s < \frac{1}{2}$ and $\text{rect}(s) = 0$ otherwise. It is noted that the last element of the equation represents blur due to the printer diffraction.

By increasing the number of "turned on" pixels in each modulation element used for modulating a pair of light beam, the number of cycles in the resulting interference pattern also increases accordingly, due to the increase in the envelope dimension d.

It can be shown that the achievable $k_1$ value of such pattern decreases when the number of cycles increases, as shown in table 1, and therefore the resolution of the printer may be improved.

TABLE 1

| Number of periods | $K_1$ |
|---|---|
| 1 | 0.38 |
| 2 | 0.29 |
| 3 | 0.27 |
| 4 | 0.26 |

Figure 3:
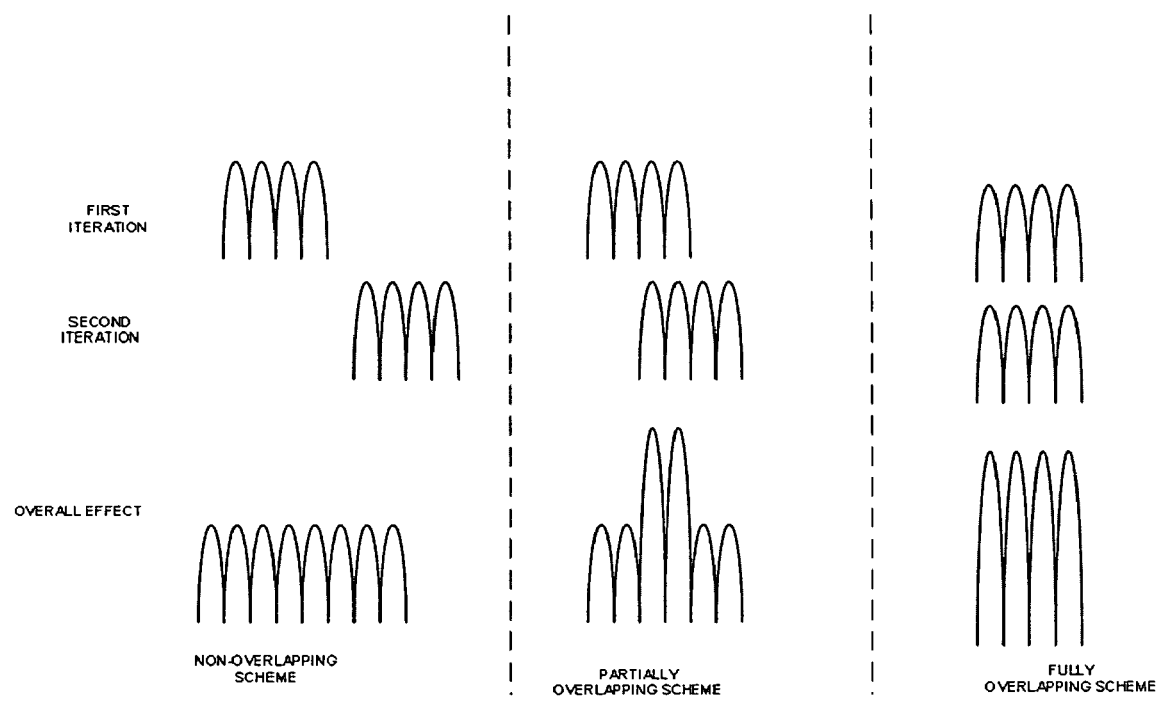
FIG. 3 illustrates various exemplary overlapping and non-overlapping printing schemes, according to various embodiments of the invention.

According to various embodiments of the invention the printer may implement a multi-pass writing scheme in which multiple light entities, that may differ by shape, may illuminate the same location in various passes, to enable printing of various patterns. High density shapes can be printed by illuminating the same spots with light entities of the same shape. Exemplary overlapping and non-overlapping schemes are illustrated in FIG. 3.

According to various embodiments of the invention, patterns other than a single beam and dense interference pattern can be generated in each pass, such as sharp edges, sharp spots and the like.

The SLM is followed by beam splitter 18 through which the light entities pass through, and a relay and optionally demagnification optics, for imaging the surface of the SLM 100 onto object 40.

According to an embodiment of the invention the relay optics includes two objective lenses positioned in a 4-F configuration. Accordingly, the focal length of lenses 20 and 22 is the same and denoted F. Lens 20 is positioned at a distance F from SLM 100, at a distance of 2 F from lens 22, and lens 22 is also positioned at a distance F from the micro-lens array 24. Said 4-F configuration relays the image formed at the surface of SLM 100 onto the micro-lens array intermediate plane 24. Micro-lens arrays 24 and 26 are positioned such as to demagnify light entities without substantially altering the distance between adjacent light entities. This optics is known in the art and is discussed in greater details in U.S. Pat. Nos. 6,133,986 and 6,424,404 of Johnson that are incorporated herein by reference. It is noted that the micro-lenses are optional and other components as well as optical de-magnification schemes can be implemented.

Figure 4A:
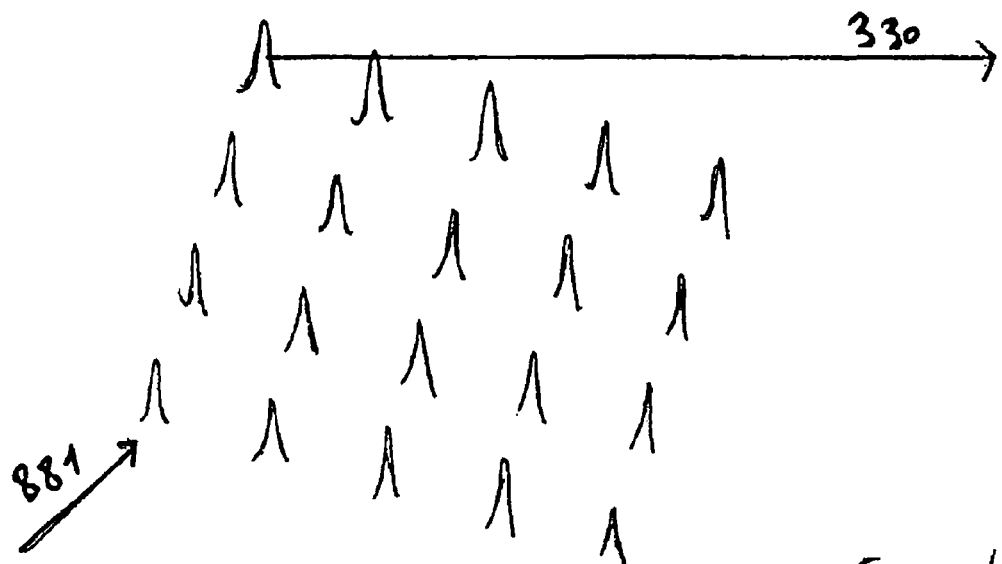
FIGS. 4a and 4b illustrate exemplary arrays of light beams and interference patterns.
Figure 4B:
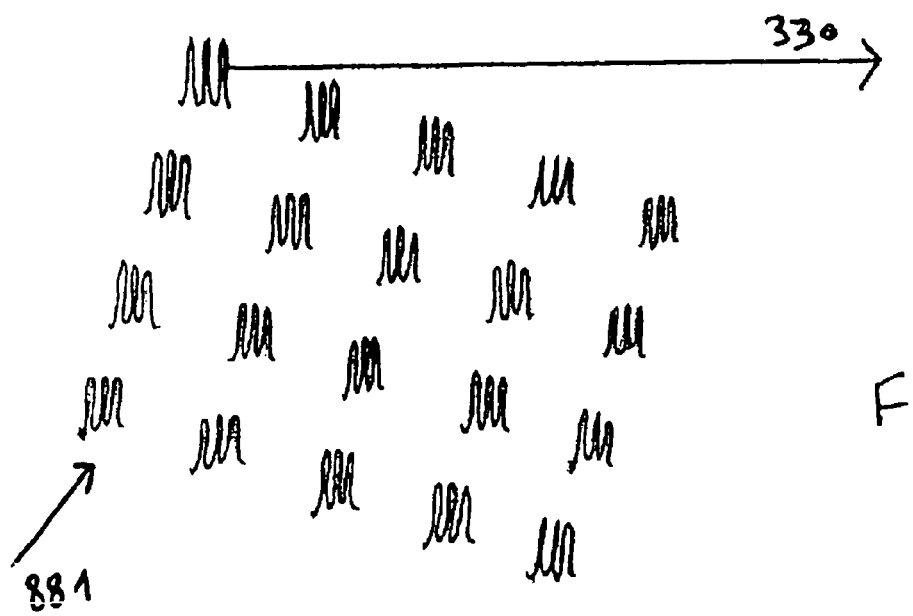

FIGS. 4a and 4b illustrate exemplary arrays of light beams and interference patterns. FIG. 4a illustrates a typical pattern used for a first pass printing, while FIG. 4b illustrates a pattern used for printing dense lines. In both cases, arrow 330 represents the scanning direction, and 881 represent the images of the modulation areas 88 of FIG. 2.

Figure 4C:
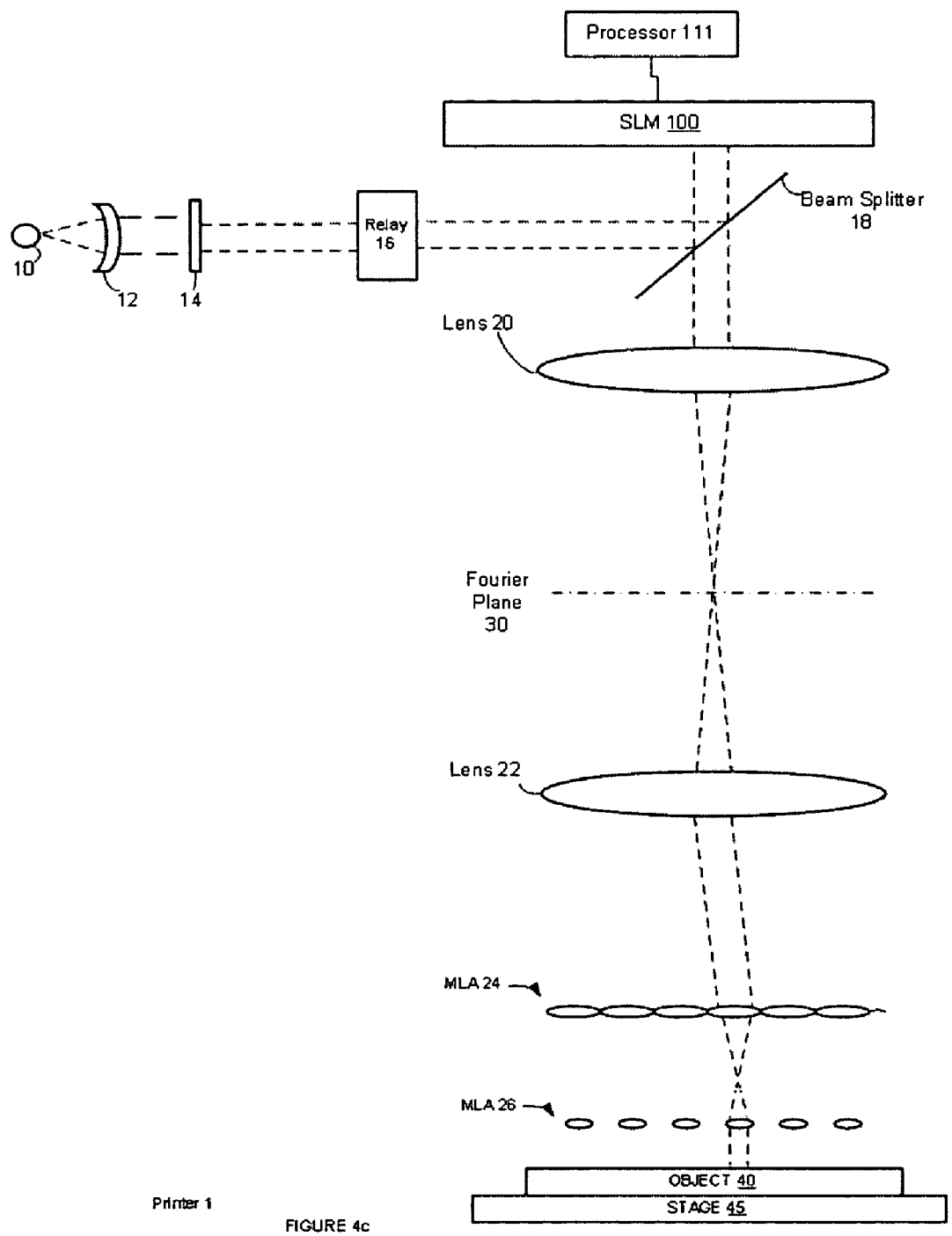
FIG. 4c illustrates a printer as well as a light beam that is used to print patterns with a first resolution, in accordance with an embodiment of the invention.

FIG. 4c illustrates the printer as well as a light beam when used to print patterns with a first resolution. In this case light source 10, which may be a continuous wave laser or a pulsed laser, provides optical radiation which is collimated by optical component 12 and passes through element 14 without being split into two beams, as illustrated in FIG. 1, passes through relay element 16 and is reflected by beam splitter 18 onto SLM 100 that modulates the light so as to produce a parallel array of modulated light beams corresponding to a desired pattern. The individual micro-mirrors of SLM 100 are responsive to an input pattern data signals provided by controller 111 such that light is selectively reflected from each SLM element, where each modulation area is preferably consisted of a single pixel in the "on" state to produce the desired pattern of parallel light beams. The parallel light beams pass back through beam splitter 18 to relay optics such as lenses 20 and 22, and then pass through MLAs 24 and 26 to provide an array of spots that interact with object 40. When used in a first resolution mode, only central pixels in the modulation area illustrated in FIG. 1 are turned on, to allow for a small spot imaging. The preferred number of pixels in this embodiment is 1 central pixel, or, alternatively, 3×3 pixels. The spots are well separated from one another to prevent cross-talk or interference between the beams.

Mechanical stage 45, which supports object 40 translates object 40 in the y direction, which is substantially parallel to one of the axes y' of a spot grid array at the object plane. The deviation from parallel is chosen such that as object 40 is translated relative to the beam array, and as the beam array is modulated to form sequential spot-grid patterns, the spot-grid patterns interlace or interleave so as to leave no gaps in the mechanical cross-scan direction (the x direction). In this way a complete image is scanned onto object 40. There are a number of ways in which this slanted scan can be implemented. For example, the beams may track paths with centers spaced apixel width apart; or they may track paths spaced one-half pixel width apart and spots on adjoining tracks could be offset one-half pixel width (or less) along the y-axis, resulting in a more tightly packed array of spots on the object. Further, scanning patterns with a pitch of less than one pixel between scan lines can be interleaved. The printer may also implement various motion compensation schemes for compensating for mechanical inaccuracies. Various compensation schemes are illustrated in U.S patent applications 20030123040 and 20030122091 of Almogy and are incorporated herein by reference.

Figure 6:
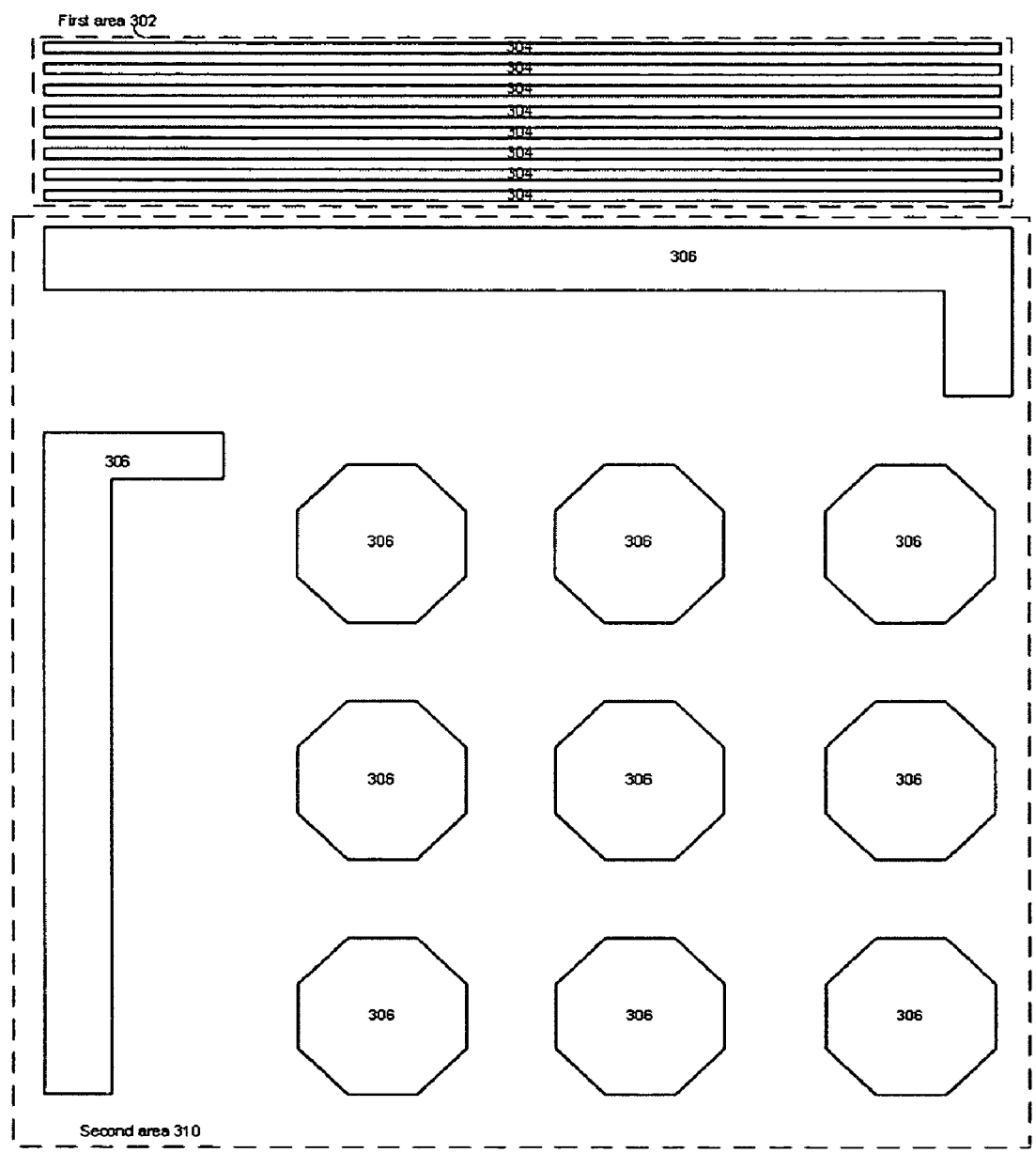
FIG. 6 illustrates an exemplary image.

FIG. 5 is a flow chart of method 200 for printing an image that comprises at least one group of highly dense shapes. An exemplary image 300 is illustrated in FIG. 6 and includes a group of highly dense shapes 304 that is located at a first area 302, as well as other shapes 306 to be printed at a first resolution and are located at second area 310.

Method 200 starts by stage 202 of determining multiple intermediate schemes such as to allow printing corresponding intermediate images on an object; wherein at least one intermediate scheme comprises directing at least one interference pattern towards at least one location corresponding to at least one group of highly dense shapes. An intermediate scheme can define the modulation of SLM 100 as well as the illumination (for example configuration of optical element 14) to be used to image a certain intermediate image onto object 40. Each intermediate scheme may determine the shape of a single array of light entities or the shapes of sequences of intermediate light entities arrays. For example, printer 1 will direct interference patterns towards locations corresponding to first area 302 while light beams are directed towards locations corresponding to the second area 310. According to various embodiments light beams are generated and directed towards the object at a first iteration while interference patterns are generated and directed towards the object at another iteration of stage 202.

Stage 202 is followed by stage 204 of generating an array of light entities in response to an intermediate scheme. As mentioned above the light entities can include either light beams or interference patterns.

Stage 204 is followed by stage 206 of directing the array of light entities towards the object to form the intermediate image. Referring to FIG. 1, the light entities are directed through lenses 20 and 22 and micro-lenses arrays 24 and 26 towards object 40.

Stage 206 is followed by stage 208 of introducing a relative translation between the object 40 and the array of light entities and jumping to stage 204. It is noted that due to said motion the light entities will be directed to multiple locations that differ from the previous locations, and that a new array of light entities corresponding to the new location can be generated. Stages 202-208 may be repeated until a predefined criterion is satisfied (for example the entire image was being printed or imaged onto object 40).

It is further noted that a multi-pass printing scheme may be implemented, thus a certain point can be subjected to multiple light entities.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein. Further, the description is intended to be descriptive and not limiting. For example, the description of the present invention refers to light sources and discusses optical sources and optical radiation in terms of light and light images. However, the inventors include all wavelengths of electromagnetic radiation when they reference "light," and not to limit it to visible wavelengths. For example, shorter wavelengths of light, referred to as ultra-violet, deep ultra-violet, extreme ultra-violet, X-rays etc all are considered within the scope of "light" as they all refer to photons and electromagnetic radiation, and are distinguished only by the wavelength of the radiation.

What is claimed is:

1. A method for printing an image on an object, comprising:

directing, as part of a first printing iteration of a printing apparatus, collimated light beams towards modulation areas of a programmable spatial light modulator (SLM), the programmable SLM being configured to provide a first selected intermediate image scheme corresponding to a first intermediate image to be printed on said object, modulating the collimated light beams to produce a first array of light entities corresponding to the first selected intermediate image scheme, and directing the first array of light entities from the programmable SLM via relay optics and a pair of micro lens arrays (MLAs) towards the object on which the image is to be printed thereby printing said first intermediate image on said object at a first resolution determined by optical characteristics of the printing apparatus;

directing, as part of a second printing iteration of the printing apparatus, the collimated light beams towards the modulation areas of the programmable SLM, the programmable SLM being configured to provide a second selected intermediate image scheme corresponding to a second intermediate image to be printed on said object, modulating the collimated light beams to produce a second array of light entities corresponding to the second selected intermediate image scheme, and directing the second array of light entities from the programmable SLM via the relay optics and the pair of MLAs towards the object on which the image is to be printed thereby printing said second intermediate image on said object at a second resolution, wherein said second selected intermediate image scheme includes an interference pattern having a period smaller than the first resolution and said second resolution is finer than said first resolution; and translating, during the printing of each of the first intermediate image and the second intermediate image, the object relative to respective ones of the first and second arrays of light entities to expose the object with the image.

2. The method of claim 1 wherein the interference pattern is characterized by highly dense interference fringes.

3. The method of claim 1 wherein each of the first and second arrays of light entities comprise light beams and interference patterns.

4. The method of claim 3 wherein the interference patterns include multiple interference fringes.

5. The method of claim 1 wherein generating the interference pattern comprises manipulating at least three elements of the programmable SLM.

6. The method of claim 5 wherein the generating of the interference pattern further comprises directing two light beams towards the at least three elements of the programmable SLM.

7. The method of claim 1 wherein the relay optics are arranged as a 4-F system.

8. The method of claim 1 wherein the collimated light beams comprise deep ultra-violet radiation.

9. The method of claim 1 wherein the collimated light beams comprise extreme deep ultra-violet radiation.

10. The method of claim 1 wherein the translating comprises moving the object along an axis slanted relative to an axis of the interference pattern.

11. The method of claim 1 wherein the translating comprises moving the object such that as the object is moved a distance substantially equal to a length of the first and second arrays of light entities in a scanning direction, the first and second arrays of light entities trace a substantially continuous path on a surface of the object in a mechanical cross-scan direction.

12. The method of claim 1 further comprising compensating for inaccuracies in the translating.

13. The method of claim 1, wherein at least some locations on the object that are exposed to the second array of light entities are not also exposed to the first array of light entities.

* * * * *